United States Patent

Deeg

(10) Patent No.: US 11,790,135 B2
(45) Date of Patent: Oct. 17, 2023

(54) METHOD AND SYSTEMS FOR PROVISION OF A SIMULATION MODEL OF AN ELECTRIC ROTATING MACHINE

(71) Applicant: Siemens Aktiengesellschaft, Munich (DE)

(72) Inventor: Christian Deeg, Altdorf (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 17/923,842

(22) PCT Filed: Apr. 21, 2021

(86) PCT No.: PCT/EP2021/060340
§ 371 (c)(1),
(2) Date: Nov. 7, 2022

(87) PCT Pub. No.: WO2021/224003
PCT Pub. Date: Nov. 11, 2021

(65) Prior Publication Data
US 2023/0222270 A1 Jul. 13, 2023

(30) Foreign Application Priority Data

May 8, 2020 (EP) .................................... 20173646

(51) Int. Cl.
*G06F 30/27* (2020.01)

(52) U.S. Cl.
CPC ..................... *G06F 30/27* (2020.01)

(58) Field of Classification Search
CPC ........................................................ G06F 30/27
See application file for complete search history.

(56) References Cited

U.S. PATENT DOCUMENTS

2003/0065634 A1* 4/2003 Parlos ................. H02P 21/0014
706/15
2019/0267923 A1 8/2019 Anders et al.

FOREIGN PATENT DOCUMENTS

| CN | 102368672 A | 3/2012 |
| CN | 108595798 A | 9/2018 |
| CN | 110007232 A | 7/2019 |
| EP | 3 322 088 A1 | 6/2018 |
| EP | 3 907 878 A1 | 11/2021 |

OTHER PUBLICATIONS

PCT International Search Report and Written Opinion of International Searching Authority dated Jul. 30, 2021 corresponding to PCT International Application No. PCT/EP2021/060340 filed Apr. 21, 2021.

* cited by examiner

*Primary Examiner* — Steven W Crabb
(74) *Attorney, Agent, or Firm* — Henry M. Feiereisen LLC (57) ABSTRACT

A computer-implemented method for providing a simulation model of an electric rotating machine is disclosed. The simulation model is defined by parameter values. Input data is obtained. The input data is collectable using the electric rotating machine when the electric rotating machine is not connected to an operating voltage and being characteristic of the electric rotating machine. The parameter values are determined from the input data using a trained function and the parameter values determined are provided.

15 Claims, 5 Drawing Sheets

METHOD AND SYSTEMS FOR PROVISION OF A SIMULATION MODEL OF AN ELECTRIC ROTATING MACHINE

CROSS-REFERENCES TO RELATED APPLICATIONS

This application is the U.S. National Stage of International Application No. PCT/EP2021/060340, filed Apr. 21, 2021, which designated the United States and has been published as International Publication No. WO 2021/224003 A1 and which claims the priority of European Patent Application, Serial No. 20173646.9, filed May 8, 2020, pursuant to 35 U.S.C. 119(a)-(d).

BACKGROUND OF THE INVENTION

The invention relates to a computer-implemented method for provision of a trained function.

What is more the invention relates to a computer-implemented method for provision of a simulation model of an electric rotating machine using the above-mentioned trained function, wherein the simulation model is defined by parameter values.

Above and beyond this the invention relates to computer programs that comprise corresponding commands and, when the corresponding program is executed by a computer, that cause said commands to carry out the one and/or the other method mentioned above.

In addition the invention relates to a sensor apparatus with a computer-readable medium that has a further simulation model, which is based on the above-mentioned simulation model.

Furthermore the invention relates to a data carrier signal that transmits the above-mentioned simulation model and/or the above-mentioned computer program(s).

What is more the invention relates to a method for linkage of an electric rotating machine to a platform, preferably to a software platform, in particular to a Cloud platform and to a method for determining the operating behavior of an electric rotating machine connected to an operating voltage and for example linked to a platform.

Above and beyond this the invention relates to an arrangement for determining the operating behavior of an electric rotating machine connected to an operating voltage, wherein the arrangement comprises a sensor apparatus and a processing facility.

Onboarding of new assets in the context of a digitalization of industry proceeding at an ever increasing pace represents an important aspect. The field devices, machines, software etc. are generally referred to as assets at the level of the system part.

For digitalization of older industrial plants the problem that is often encountered is that the information about the machines, e.g. about electric rotating machines, in particular about asynchronous machines, for example asynchronous motors and generators, in the system is not adequate for creating a sufficiently exact simulation model of the machine and for example for carrying out the onboarding or determining operating points of the machines.

Even if an equivalent circuit (a simulation model) of an asynchronous motor is known ("greenfield"), it is often difficult to determine its operating behavior. One possible solution to this "greenfield" problem is proposed in the applicant's EP 20 173 618.8, of which the content is hereby incorporated into the subject matter of this application. Often complex measurements by means of expensive sensors are needed for this.

With many motors, from older ranges for example, there is not infrequently even less information available. The information is often restricted just to data ("brownfield") that is to be found on a type plate (rating plate).

One possible approach for dealing with the problem and determining the operating behavior is to switch to simpler methods (e.g. linear interpolation). These however suffer from marked imprecision and moreover merely supply information about the torque, but not more detailed specifications however, such as e.g. efficiency and power factor.

The object of the present invention can thus be seen as provision of a simulation model of an electric rotating machine and for example making possible the onboarding of the electric rotating machines using just a little available information and, in doing so, to dispense with expensive measurements, such as e.g. measurements when idling (e.g. cold resistance measurement) in conjunction with rotating measurements when running under no load (electromotive series) and under load (load series).

SUMMARY OF THE INVENTION

The object is achieved in accordance with the invention with a computer-implemented method for provision of a simulation model of an electric rotating machine of the said type, wherein the simulation model is defined by parameter values by input data being obtained, wherein the input data is able to be collected using the machine in a state not connected to an operating voltage and is characteristic of the machine and comprises a shaft height, a number of pole pairs and rating plate specifications of the electric rotating machine, the parameter values are determined from the input data with the help of a trained function, wherein the trained function is provided according to a method given below, wherein based on the shaft height and the number of pole pairs the trained function determines loss and stray coefficients, wherein the parameter values are determined from the loss and stray coefficients and rating plate specifications determined, the parameter values determined are provided.

In connection with the present invention the term "with the help of" is to be understood as the determination of the parameter values being able to comprise a number of substeps, wherein the trained function F does not have to be applied in each substep. For example the method can have substeps that can be carried out with the aid of analytical mathematical formulae. This can be of advantage in respect of processing time.

In connection with the present invention the term "connected to an operating voltage" can be understood as a state of the electric rotating machine in which the machine is connected to an operating voltage constant in level and frequency (constant voltage network) or variable (converter operation).

Preferably the control method of the converter is known, whereby the unknown converter output voltage can be determined from the frequency $f_1$ determined by sensors.

In one form of embodiment there can be provision for the simulation model to be embodied as the equivalent circuit diagram.

It is also conceivable for the simulation model to be present in the form of coherent equations or in tabular form.

In one form of embodiment there can be provision for the trained function to be based on a neural network, on a regression, preferably on a multivariate regression.

Above and beyond this there can advantageously be provision for the input data to be subjected to a plausibility check.

In one form of embodiment there can be provision for the input data to consist of rating plate specifications.

In this case there can be provision for a part of the parameter values to be determined by the rating plate specifications. This enables the method to be simplified by values of specific parameters being computed directly from the rating plate specifications.

It is entirely conceivable for the input data merely to consist of the shaft height and the number of pole pairs. Good results can be obtained with such input data.

The advantage of a multivariate regression and in particular also that of a neural network lies in the fact that the training input data does not have to be restricted and also does not have to be explicitly sought out. This is especially advantageous when the input data comprises more than two input variables (e.g. shaft height and number of pole pairs), for example a plurality of input variables and the neural network is supplied with the input variables in order to determine the simulation model parameters.

What is more the object is inventively achieved with a computer-implemented method for provision of a trained function of the said type by
- training input data being obtained that is characteristic/representative of electric rotating machines and is able to be collected using the machines in a state not connected to an operating voltage, wherein the training input data comprises shaft heights and number of pole pairs,
- training output data being obtained that is representative of parameter values and comprises loss and stray coefficients, wherein the parameter values define simulation models of the electric rotating machines,
- a function being trained based on the training input data and the training input data,
- the trained function being provided.

In one form of embodiment there can be provision for a training dataset, which comprises training input and training output data, to be able to be preprocessed before the function is trained on the training dataset. The preprocessing can for example comprise bringing the data into a relative and normalized form.

It can be expedient for the function to be based on a regression, preferably on a multivariate regression.

The function can also be based on a neural network, so that the above-mentioned trained function can likewise be based on a neural network.

What is more the object is inventively achieved with a first computer program, by the first computer program comprising commands that, when the program is executed by a computer, cause said computer to determine the simulation model parameter values.

The computer program thus obtains input data as input and outputs simulation model parameter values as output. Since the simulation model is defined by the simulation model parameter values the expressions provision of a simulation model or determination of the simulation model parameter values can be used equally well.

The object is also inventively achieved with a second computer program that comprises computer program commands that, when the program is executed by a computer, cause said computer to provide the trained function.

The first and/or the second computer program can be stored on a computer-readable medium or be transmitted with a data transmission signal, e.g. in an encoded form.

In addition, the object of the invention is inventively achieved with a method for linkage of an electric rotating machine to a platform, preferably a software platform, in particular a Cloud platform of the said type, by
- input data, which comprises a shaft height, a number of pole pairs and rating plate specifications of the machine, being collected using the machine in a state not connected to an operating voltage, wherein the input data is characteristic of the machine and is entered as input for configuration application software, wherein
- the configuration application software transfers the input data to the platform, wherein the platform comprises commands that bring about the execution of the above-mentioned method by the platform for provision of a simulation model of the electric rotating machine, wherein
- preferably the simulation model is transferred to the configuration application software, wherein the configuration application software transmits the simulation model to a sensor apparatus arranged on the machine, preferably fastened to it.

Furthermore, the object of the present invention is inventively achieved with a method for determining the operating behavior of an electric rotating machine connected to an operating voltage and for example linked to a platform by
A) a stray magnetic field outside the machine being detected,
B) a slip frequency $f_2$ and a synchronous frequency or synchronous speed $f_1$ being computed from the detected stray magnetic field,
C) a slip s being computed from the slip frequency $f_2$ and the synchronous frequency or synchronous speed $f_1$,
D) a simulation model being provided according to the above-mentioned method,
E) operating behavior of the machine and in particular its operating point being determined using the slip s, the synchronous frequency $f_1$ and the simulation model provided.

In addition the object of the present invention is inventively achieved with an arrangement of the said type by the sensor apparatus being embodied to detect a stray magnetic field outside the machine and to compute a slip frequency $f_2$ and a synchronous frequency $f_1$ from the detected stray magnetic field and to transfer this to the processing facility, wherein a simulation model provided in accordance with the above-mentioned method is stored on the processing facility and the processing facility is configured, using the computed slip frequency $f_2$ and synchronous frequency $f_1$, to determine a slip s and subsequently the operating behavior of the machine by means of the simulation model.

BRIEF DESCRIPTION OF THE DRAWING

The invention will be described and explained in greater detail below with the aid of the exemplary embodiments shown in the figures. In the figures.

DETAILED DESCRIPTION OF PREFERRED EMBODIMENTS

Elements that are the same or that act in the same way can each be provided with the same reference characters in the exemplary embodiments and figures.

Figure 1:
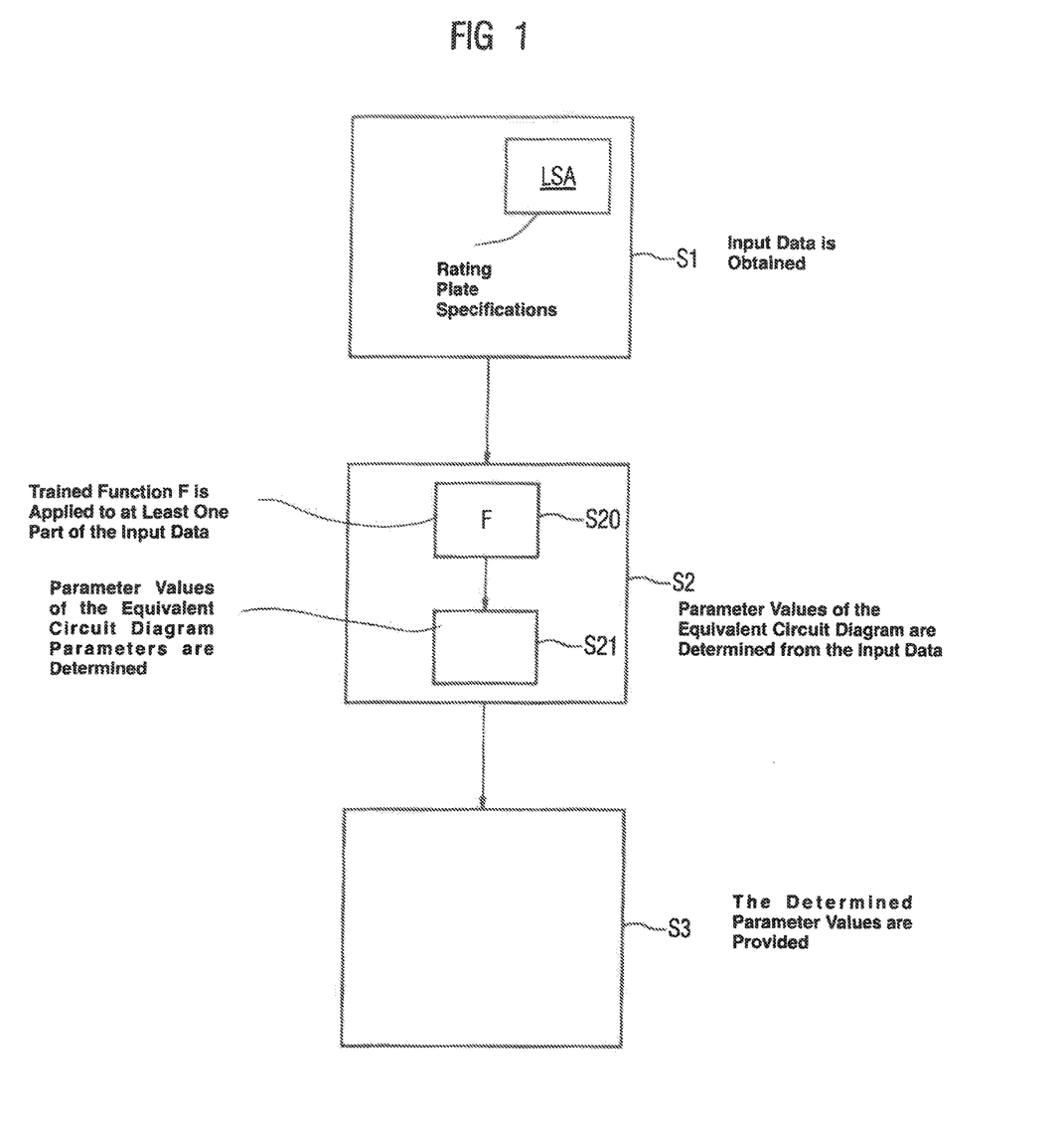
FIG. 1 shows a flow diagram of a computer-implemented method for provision of an equivalent circuit diagram.

The reader is first referred to FIG. 1. Shown in FIG. 1 as a flow diagram is a form of embodiment of a computer-implemented method for provision of a simulation model of an electric rotating machine 2. Equivalent circuit diagrams EC1, EC2, EC3 are considered below as an example of the simulation model. Use of other simulation models, such as e.g. simulation models in the form of coherent equations or in tabular form, is likewise possible.

Figure 2:
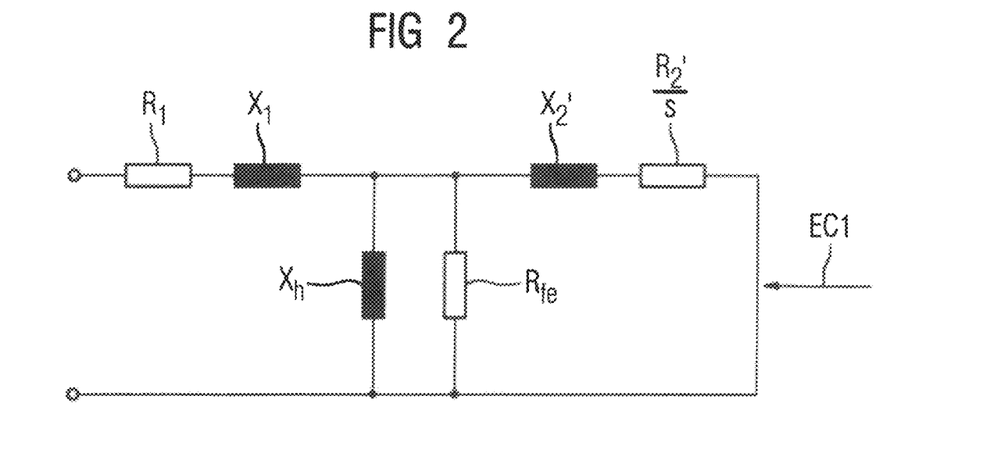
FIG. 2 to FIG. 4 show possible equivalent circuit diagrams.
Figure 3:
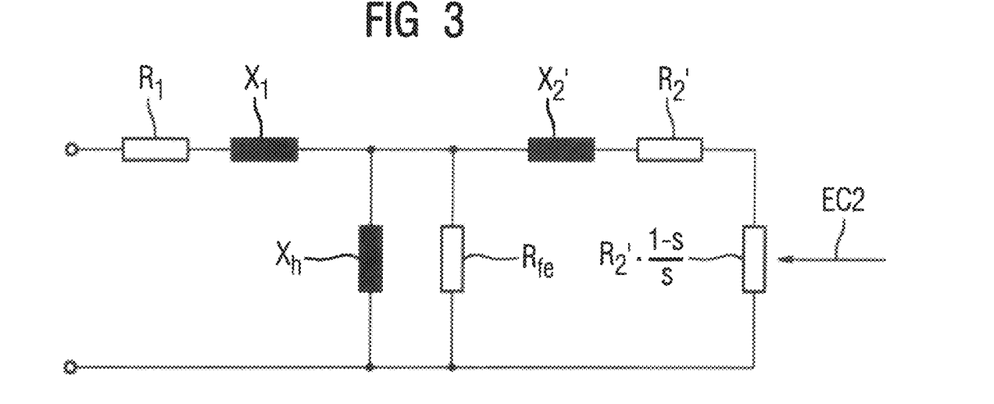
Figure 4:
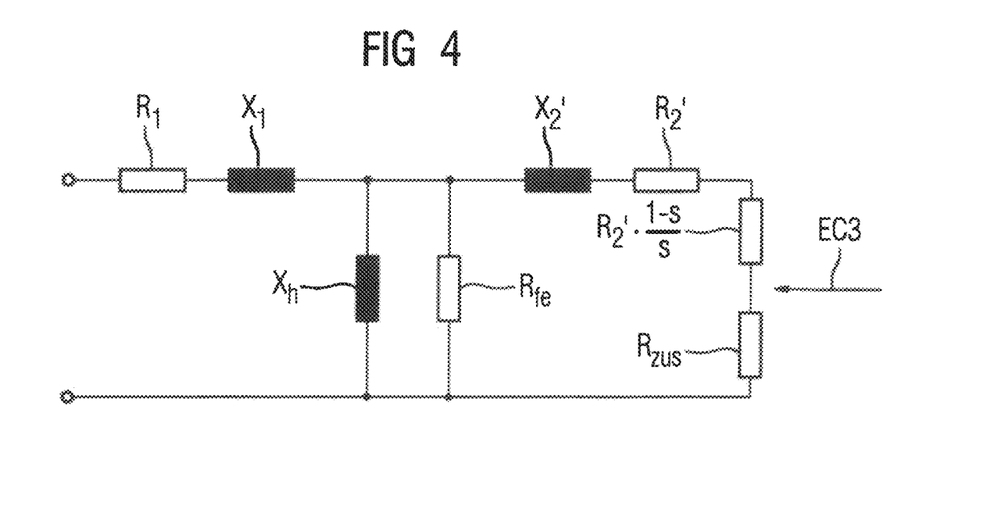

The equivalent circuit diagram EC1, EC2, EC3 is defined by values of predetermined parameters. FIG. 2 to 4 show examples of different equivalent circuit diagrams EC1, EC2, EC3. FIG. 2 relates to a T-equivalent circuit diagram EC1, FIG. 3—a T-equivalent circuit diagram EC2 with separated rotor resistance, which is equivalent in value to the T-equivalent circuit diagram of FIG. 2 and FIG. 4—an expanded equivalent circuit diagram EC3 with the following parameters: Main inductance X (main flux), stator $X_1$ and rotor inductance $X'_2$ (stray fluxes), rotor resistance $R'_2$ (rotor winding losses), stator resistance $R_1$ (stator winding losses), $R_{fe}$ (iron losses) and $R_{zus}$ (additional losses).

Without restricting the scope of the present disclosure and for the sake of simplicity of the representation, the term "equivalent circuit diagram" below is to be understood as the expanded equivalent circuit diagram EC3.

In a step S1 of the method input data is obtained. The input data is able to be collected using the machine 2 in a state not connected to an operating voltage and is characteristic of the machine 2. In this case the input data can for example be fed in via a first interface into a processing facility, e.g. entered as input into a configuration App. The input data is the data that identifies the machine 2. The input data for example comprises rating plate specifications LSA—manufacturer specifications, standards information, regulatory information etc. that characterizes the machine at the measurement point (with a load of 100%). Further input data, which can be collected using the non-connected machine, but does not have to be specified on its rating plate for example, is for example number of pole pairs, shaft height etc.

The method can further comprise a plausibility check of the input data (not shown here). In this it can be checked for example whether level of efficiency and power factor at the measurement point, when given, lead to a sufficiently small error in the computation of a mechanical rated power as a function of rated voltage and rated current.

In a step S2 the parameter values of the equivalent circuit diagram EC3 are determined from the input data with the help of a trained function F.

In connection with the present invention the term "with the help of" is understood as the determination of the parameter values being able to comprise a number of substeps, wherein the trained function F does not have to be applied in each substep.

FIG. 1 shows a form of embodiment in which step S2 comprises two substeps—a first substep S20 and a second substep S21. The first substep S20 can for example be that step in which the trained function F is applied to at least one part of the input data. This part of the input data comprises for example the shaft height and the number of pole pairs of the machine 2. In this case the trained function F can for example determine from the at least one part of the input data loss and stray coefficients for determining the parameter values of the equivalent circuit EC3 of the machine 2.

The trained function F can for example be based on a regression, preferably on a multivariate regression.

Using the parameters determined in the first substep S20, for example the loss and the stray coefficients and the remaining part of the input data—the rating plate specifications LSA—in the second substep S21 the parameter values of the equivalent circuit diagram parameters can for example be determined via other physical variables, preferably with the aid of a predetermined mathematical formula or formulae.

A non-definitive list of the physical variables that can be determined in step S2, preferably in the second substep S21, preferably calculated with the aid of a predetermined mathematical formula or formulae, is: pole pair number, synchronous speed, slip, input power, additional losses, individual stator winding, iron and friction losses and their sums, stator resistance, total reactive power, maximum possible stray coefficient etc.

For example, the number of pole pairs, synchronous speed and rated slip can be determined from rated frequency $f_N$ and rated speed $n_N$, which can be specified on the type plate. Furthermore, an electrical input power at a measurement point (operation as motor) is able to be computed from current, voltage and power factor (each at measurement point) or from mechanical output power and efficiency (each likewise at measurement point).

The additional losses can be calculated for example in accordance with a standard or a norm, e.g. in accordance with a method according to IEC60034-2-1 or EN60034-2-1.

In a further step S3 the parameter values determined—main inductance $X_h$ (main flux), stator $X_1$ and rotor inductance $X'_2$ (stray fluxes), rotor resistance $R'_2$ (rotor winding losses), stator resistance $R_1$ (stator winding losses), $R_{fe}$ (iron losses) and $R_{zus}$ (additional losses)—can be provided. This can be undertaken for example by means of output via a second interface (see for example FIG. 6). For example, the equivalent circuit diagram EC3 with the parameter values determined can be stored by storing the parameters in a database 8, for example in a Cloud 4.

Figure 5:
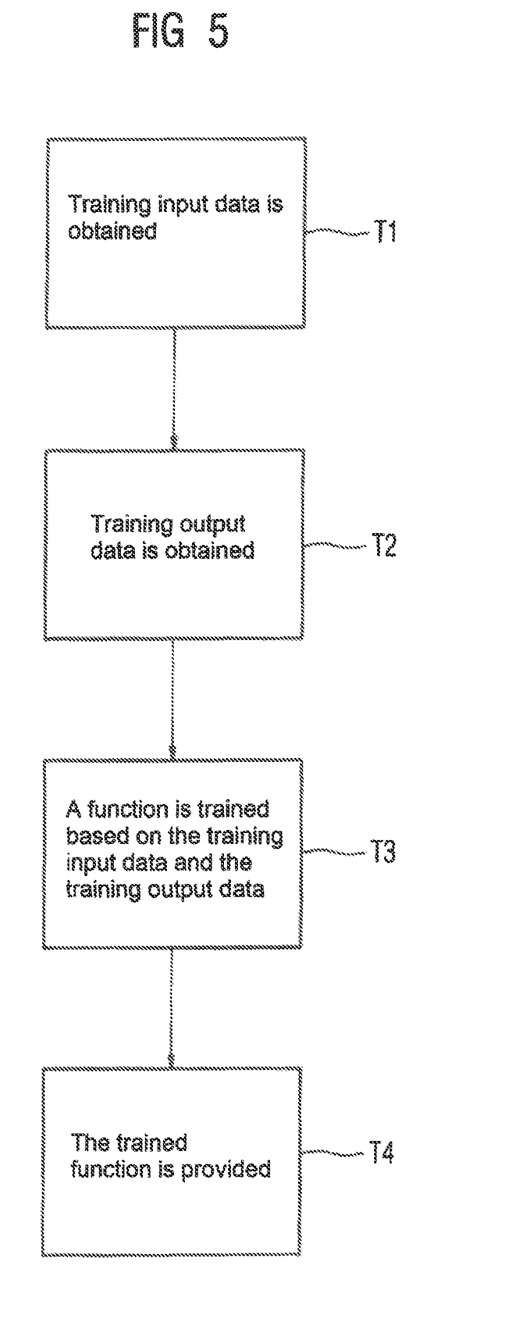
FIG. 5 shows a flow diagram of a computer-implemented method for provision of a trained function.

FIG. 5 shows a possible form of embodiment of a computer-implemented method for provision of a trained function, for example the above-mentioned trained function F.

In a step T1 training input data is obtained, for example by means of a first training interface. Training input data is characteristic or representative of electric rotating machines and is able to be collected using the machines in a state not connected to an operating voltage. The training input data comprises shaft heights and number of pole pairs.

In a step T2 training output data, obtained for example by means of the first training interface, which is representative of parameter values and loss and stray coefficients, is obtained, wherein the parameter values define the equivalent circuit diagrams of the electric rotating machines.

I.e. the training dataset comprises data of those machines for which the equivalent circuit diagram parameter values are already known. For example, this can be data of asynchronous machines, e.g. asynchronous motors or generators, of known types.

The training dataset that comprises training input and training output data can be preprocessed before the function is trained on the training dataset. The preprocessing can for example comprise bringing the data into a relative and normalized form.

In a step T3 a function is trained based on the training input data and the training output data.

In a step T4 the trained function F is provided for example by means of a second training interface.

The function can for example be based on a regression, preferably a multivariate regression.

The training input data can comprise shaft heights (e.g. 63 mm to 450 mm), preferably shaft heights and number of pole pairs (e.g. 2 to 8) and the training output data loss and stray coefficients. It goes without saying that the method also functions for other shaft heights (e.g. less than 63 mm and greater than 455 mm) and number of pole pairs.

The training dataset can thus comprise data from electric rotating machines, e.g. from asynchronous machines of the same or similar type, for which a dependence of the equivalent circuit diagram parameters on their shaft height or on their shaft height and their number of pole pairs is known.

What is more the trained function can be validated. This can be done for example in a load range of 50 to 125%.

The training dataset can comprise data of 1000 to 2000 asynchronous machines of different types.

The function can also be based on a neural network, so that the above-mentioned trained function F can likewise be based on a neural network.

Each of the above-mentioned computer-implemented methods can be present in the form of commands of a computer program, wherein the commands, when the computer program is executed by a computer or in general by a data processing system, cause the computer or the data processing system to carry out the corresponding method.

The computer program(s) can be stored on a computer-readable medium or be transmitted with a data carrier signal. This likewise applies to the products of the method, i.e. to the equivalent circuit diagram EC1, EC2, EC3 with the parameter values determined and to the trained function F, which can be stored on a computer-readable medium or transmitted with a data carrier signal.

Figure 6:
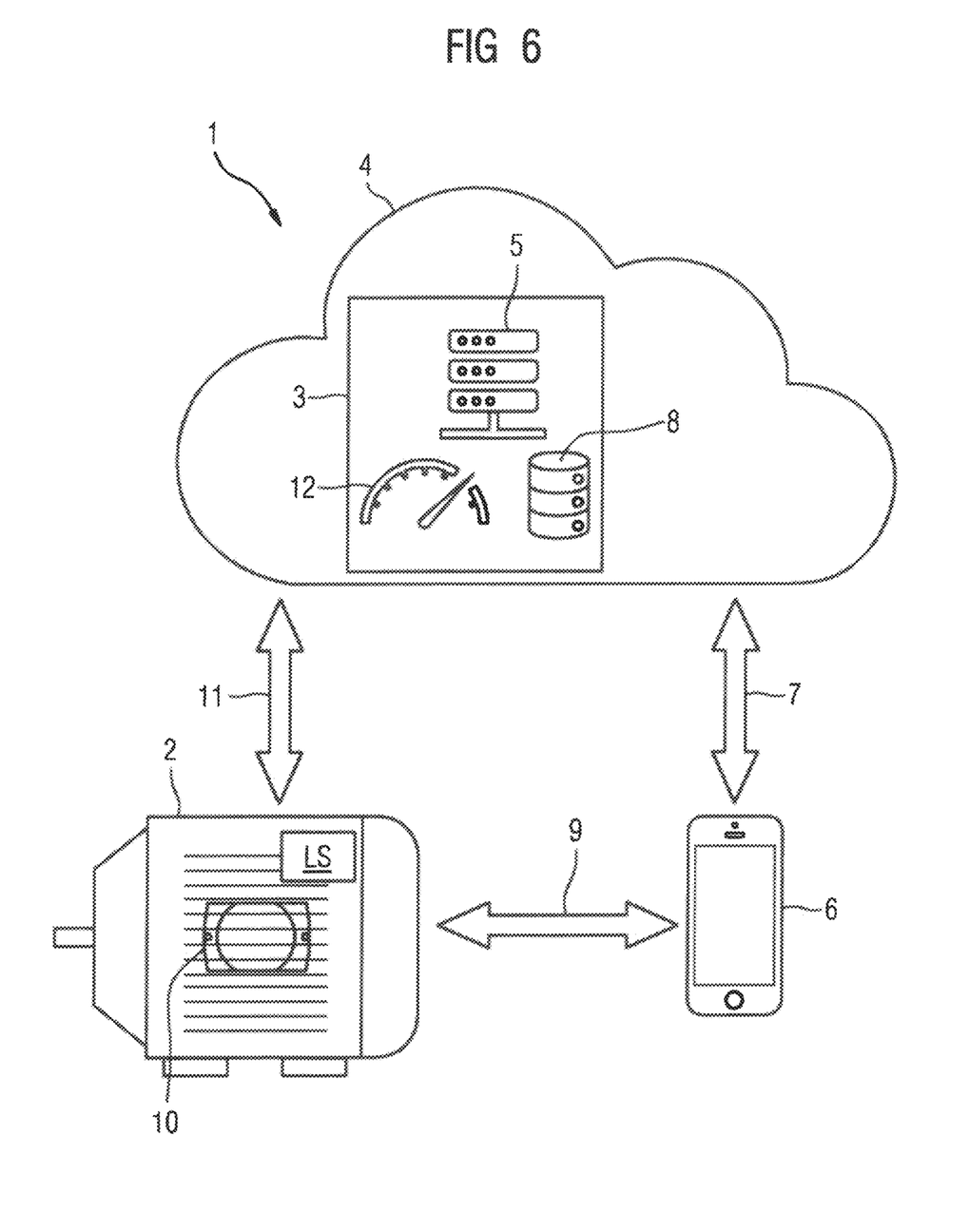
FIG. 6 shows an industrial IT environment.

FIG. 6 shows an industrial IT environment 1, in which one form of embodiment of the method for linkage or for onboarding of new assets—here of an electric rotating machine 2—to a platform 3 can be carried out. The platform can be embodied for example as a software platform, and in particular as a platform 3 based in a Cloud 4—a Cloud platform 3. The Cloud can for example be designed as an IoT, in particular as an IIoT Cloud 4.

The Cloud platform 3 can comprise one or more computing units. The Cloud platform 3 can for example comprise the above-mentioned computer program with which parameter values for an equivalent circuit diagram of the machine 2 can be provided. This computer program can for example be stored in the Cloud 4 on a backend server 5.

In the present example it is assumed that neither the spare part image nor the equivalent circuit diagram parameters of the machine 2 are known. It can be assumed that the machine 2 is described for example by the expanded equivalent circuit diagram EC3. The parameter values for this equivalent circuit diagram can be determined for example with the aid of the above-mentioned form of embodiment of the method as described below.

When the equivalent circuit diagram parameters of the machine 2 are known, the IT environment 1 can be used for training a function F, for example as described above. For this purpose for example the backend server 5 can have a computer program with the corresponding commands.

First of all, using the machine 2, e.g. the asynchronous motor or generator, input data that is characteristic of the machine 2 is collected in a state not connected to an operating voltage and can be entered as input into configuration application software.

This can be done by a user for example, who for example initially collects data relevant to the asset, e.g. to the machine, in particular to the asynchronous motor, in that he/she reads off specifications from a rating plate LS, which measures the shaft height of the asynchronous motor 2. Above and beyond this the number of pole pairs can be calculated from the rating plate specifications, for example with the method described above.

On setup of the asynchronous motor or generator 2, he/she, as part of what is known as the onboarding, can enter the input data obtained into a configuration App on a mobile device 6, e.g. smartphone/handheld.

The configuration App can transmit the input data over a data connection 7, for example WLAN or GSM mobile radio, to the IoT Cloud 4, in particular to the backend server 5.

The input data can also be stored in a database 8, wherein the database 8 can be designed as a database of the Cloud platform 3 (shown here) or also as a Cloud database of a third party (not shown here).

The computer program stored on the backend server 5 can access the database 8.

The computer program subsequently accesses the input data and creates/determines for the asynchronous motor 2 the associated simulation model EC3, i.e. the parameter values.

The method can be repeated for each new asset.

Subsequently, in an intermediate step, the information content of the simulation model is reduced for reasons of information security. In this case the expanded equivalent circuit diagram EC3 with the parameter values determined can be converted into a compressed or reduced equivalent circuit diagram.

The reduced equivalent circuit diagram has a smaller information content than the expanded equivalent circuit diagram. In the reduced equivalent circuit diagram equivalent circuit diagram elements can be combined or removed entirely. In this case, in the computation on the IoT device, the reduced information content is at least partly expanded again by (plausible) assumptions being made, which however are only applicable to the individual motor—and not necessarily exact. Therefore the statements about operating behavior can be very restricted and merely restrict themselves to torque and power.

The simulation model—equivalent circuit diagram EC3 with the parameter values determined—can subsequently be stored for example in the platform database 8 or on the backend server 5, in order—in the further course of the onboarding—to be able to be retrieved for the configuration App, or be transmitted without intermediate storage to the configuration App.

After the configuration App has the simulation model available to it, it can transmit the simulation model over a further, for example radio-based, data connection 9, e.g. Bluetooth or WLAN, to an IoT device 10, which is arranged on the asynchronous motor 2, preferably fastened to it.

The IoT device 10 can be embodied as a sensor apparatus, which is embodied and configured to create sensor data and to use the simulation model (equivalent circuit diagram EC3 or the reduced equivalent circuit diagram with the parameter values determined), in order for example to calculate from the sensor data with the aid of the simulation model data of the current motor operating point or Asset KPIs (KPIs for Key Performance Indicators). A computing unit and/or a computer-readable memory medium (not shown here) can be provided for this in the IoT device 10.

The IoT device 10 is preferably not linked to any machine sensors within (or also outside) the machine 2. For the determination of the operating behavior described here (see e.g. description for FIG. 7) no expensive and high-maintenance sensors, which can measure current or voltage for example, are necessary. The IoT device 10 is therefore very low-cost and maintenance-friendly. In this case for example a torque and/or a power, e.g. mechanical shaft power and/or a power factor and/or an efficiency can be determined.

The computed asset KPIs (the operating behavior of the asynchronous motor 2) can be transferred via a further preferably radio-based data connection 11, e.g. WLAN, for example at (time) intervals that can be set, to the IoT Cloud platform 3. There the asset KPIs can be subjected to further IT processing or be stored in the database 8 or on the backend server 5. Furthermore the asset KPIs can be displayed on a display facility arranged in the frontend of the IoT Cloud platform for example, e.g. on a dashboard 12.

The data connections 7, 9, 11 are preferably all bidirectional.

In one form of embodiment (not shown here) transmission of the simulation model to the IoT device 10 can be dispensed with. In this case the above-mentioned compression of the equivalent circuit can also be dispensed with, whereby better results can be obtained. Instead, the calculation of the asset KPIs (of the operating behavior of the asynchronous motor or generator 2) can be relocated into the IoT Cloud platform 3.

Figure 7:
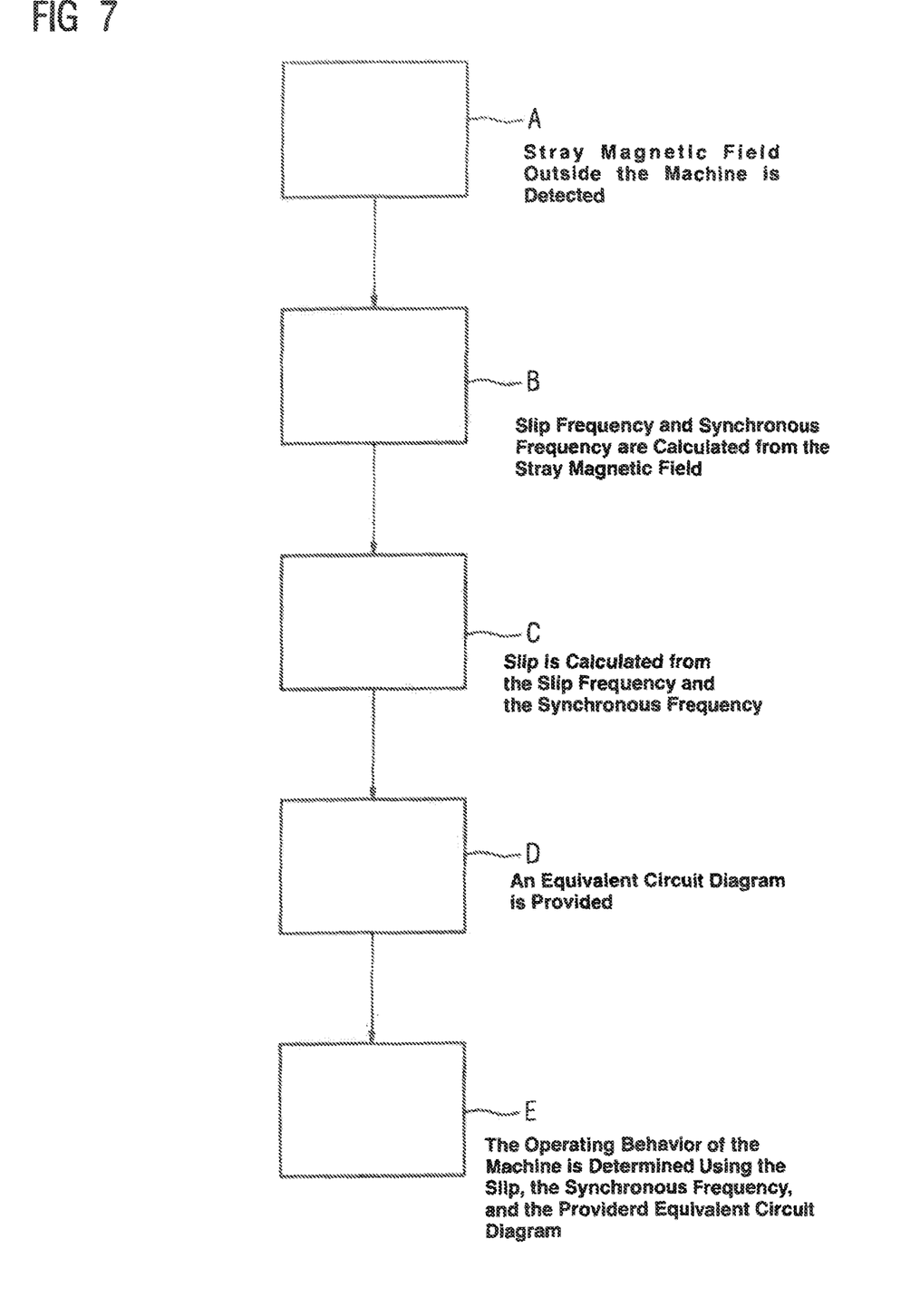
FIG. 7 shows a flow diagram of a method for determining the operating behavior of an electric rotating machine.

FIG. 7 shows a flow diagram of a form of embodiment of a method mentioned cursorily above for determining the operating behavior of the machine 2 when it is put into service.

In a step A stray magnetic field outside the machine 2 is detected. In a step B a slip frequency $f_2$ and a synchronous frequency $f_1$ are calculated from the stray magnetic field detected. In a step C a slip s is calculated from the slip frequency $f_2$ and the synchronous frequency $f_1$. This can be done for example by means of signal processing software. In a step D, as described above, an equivalent circuit diagram (the equivalent circuit diagram parameter values determined) is provided (e.g. by means of a data transmission from the mobile device 6). The provision of the equivalent circuit diagram by means of a data transmission from a mobile device 6 preferably does not take place during the measurement or calculation sequence. Instead, the equivalent circuit diagram can be transmitted during the onboarding and stored on the IIOT device.

In a step E, using the slip s, the synchronous frequency $f_1$ and the equivalent circuit diagram provided (the equivalent circuit diagram parameter values determined) the operating behavior of the machine 2 and in particular its operating point can be determined.

All of the steps A to C and E can be carried out for example by means of the IoT device 10.

It is however also conceivable for the IoT device 10 to merely carry out one or more of the steps A to C and for the rest of the steps to be carried out by another computing unit, e.g. a local server or by the backend server 5. For example, the IoT device 10 can transfer stray magnetic field data to this computing unit for further processing and analysis.

Thus an arrangement for determining the operating behavior of an electric rotating machine 2 connected to an operating voltage can comprise a sensor apparatus 10 and a processing facility, which are configured and interoperate in such a way that the steps A to E of the method are carried out. The processing facility can for example comprise the backend server 5, the mobile device 6, the database 8 and the display facility 12 (see FIG. 6).

Although the invention has been illustrated and described in greater detail by the exemplary embodiments, the invention is not restricted by the disclosed examples. Variations hereof can be derived by the person skilled in the art without departing from the scope of protection of the invention as defined by the claims given below. In particular the described method for provision of an equivalent circuit diagram can be improved by features that are claimed with regard to the method for provision of a trained function and vice versa. This applies mutatis mutandis to the method for linkage of an electric rotating machine to a platform, the method for determining the operating behavior of an electric rotating machine connected to an operating voltage and to the arrangement for determining the operating behavior of an electric rotating machine connected to an operating voltage.

What is claimed is:

1. A method for linkage of an electric rotating machine to a platform, the method comprising:
    collecting input data using the electric rotating machine in a state when the electric rotating machine is not connected to an operating voltage, said input data comprising a shaft height, a number of pole pairs and rating plate specifications of the electric rotating machine, wherein the input data is characteristic of the electric rotating machine;
    entering the collected input data as input for configuration application software;
    transmitting the input data with the configuration application software to a platform;
    providing a simulation model of the electric rotating machine with the platform;
    obtaining the input data with the platform;
    determining parameter values defining the simulation model from the input data with the platform and with the help of a trained function, wherein the trained function was trained by training input data and training output data, wherein the training input data is characteristic of electric rotating machines, and the training input data is collectable using the electric rotating machines in a state in which the electric rotating machines are not connected to an operating voltage, the training input data comprising shaft heights and number of pole pairs of the electric rotating machines, wherein the training output data comprises loss and stray coefficients of the electric rotating machines and are representative of parameter values, which define simulation models of the electric rotating machines;
    determining with the trained function, based on the shaft height and the number of pole pairs of the electric rotating machine, loss and stray coefficients of the electric rotating machine; and
    determining the parameter values from the determined loss and stray coefficients and the rating plate specifications of the electric rotating machine.

2. The method of claim 1, further comprising:
    transferring the simulation model to the configuration application software; and
    transmitting the simulation model with the configuration application software to a sensor apparatus arranged on the electric rotating machine.

3. The method of claim 2, further comprising preprocessing a training dataset, which comprises the training input data and the training output data, before the function is trained on the training dataset.

4. The method of claim 3, wherein the preprocessing comprises bringing the training input data and the training output data into a relative and normalized form.

5. The method of claim 1, wherein the platform is a software platform.

6. The method of claim 1, wherein the platform is a Cloud platform.

7. The method of claim 1, wherein the trained function is based on a neural network, or on a regression.

8. The method of claim 7, wherein the function is based on a multivariate regression.

9. The method of claim 1, further comprising subjecting the input data to a plausibility check.

10. The method of claim 1, further comprising arranging the simulation model as an equivalent circuit diagram.

11. The method of claim 10, wherein the equivalent circuit diagram is an expanded equivalent circuit diagram.

12. A method for determining an operating behavior of an electric rotating machine connected to an operating voltage, the method comprising:
linking the electric rotating machine to a platform in accordance with the method set forth in claim 1;
detecting a stray magnetic field outside of the electric rotating machine;
calculating a slip frequency and a synchronous frequency from the detected stray magnetic field;
calculating a slip from the slip frequency and the synchronous frequency;
and
determining the operating behavior of the electric rotating machine using the slip, the synchronous frequency and the simulation model provided by the platform.

13. The method of claim 12, further comprising determining an operating point of the electric rotating machine based on the slip, the synchronous frequency, and the simulation model.

14. An arrangement for determining an operating behavior of an electric rotating machine connected to an operating voltage, the arrangement comprising:

a processing facility;

a sensor apparatus embodied to detect a stray magnetic field outside of the electric rotating machine and to calculate a slip frequency and a synchronous frequency from the detected stray magnetic field and to transfer the calculated slip frequency and synchronous frequency to the processing facility;

a simulation model of the electric rotating machine stored on the processing facility, the simulation model provided by a computer program, the computer program comprising corresponding commands which, when executed by a computer, causes the computer to:

obtain input data;

determine parameter values defining the simulation model from the input data with the help of a trained function, wherein the trained function was trained by training input and training output data, the training input data being characteristic of electric rotating machines, is collectable using the electric rotating machines in a state in which the electric rotating machines are not connected to an operating voltage and comprises shaft heights and numbers of pole pairs of the machines, wherein the training output data comprises loss and stray coefficients of the electric rotating machines and is representative of parameter values which define simulation models of the electric rotating machines;

determine with the trained function, loss and stray coefficients of the electric rotating machine based on the shaft height and the number of pole pairs of the electric rotating machine, wherein the parameter values are determined from the determined loss and stray coefficients and the rating plate specifications; and the processing facility configured to determine a slip and then by the simulation model provided by the computer program, the operating behavior of the electric rotating machine using the calculated slip and synchronous frequency.

15. The method of claim 2, wherein the sensor apparatus is fastened to the electric rotating machine.

* * * * *